Oct. 26, 1965 C. H. KNOWLES 3,214,652

TRANSISTOR COMPRISING PRONG-SHAPED EMITTER ELECTRODE

Filed March 19, 1962 2 Sheets-Sheet 1

INVENTOR.
Carl Harry Knowles

BY Mueller & Aichele

ATTY'S.

TRANSISTOR COMPRISING PRONG-SHAPED EMITTER ELECTRODE

Filed March 19, 1962 2 Sheets-Sheet 2

INVENTOR.
Carl Harry Knowles

BY Mueller & Aichele

ATTY'S.

United States Patent Office 3,214,652

Patented Oct. 26, 1965

3,214,652

TRANSISTOR COMPRISING PRONG-SHAPED EMITTER ELECTRODE

Carl Harry Knowles, Phoenix, Ariz., assignor to Motorola, Inc., Chicago, Ill., a corporation of Illinois Filed Mar. 19, 1962, Ser. No. 180,458
5 Claims. (Cl. 317—235)

This invention relates to semiconductor devices, and in particular relates to transistors having semiconductor regions and metal contacts with specific configurations which improve the current handling and high frequency characteristics of the transistor.

The electrical performance of a transistor is affected in several ways by the geometry and dimensions of its emitter and base regions, and of the metal contacts to those regions. These geometric and dimensional effects are particularly significant in transistors which must have good frequency response up to a few hundred megacycles, or higher, and yet be capable of operating at reasonably high power levels. Considering first the emitter region, if the area of that region is too large, the emitter-to-base and collector-to-base capacitances will be large enough to unduly reduce the gain of the devices at high frequencies and high current levels. At very low current levels, current gain falls off with decreasing current because recombination of current carriers has a greater effect. It has been found that within limits, the smaller the emitter area, the higher the gain at low emitter current levels. On the other hand, if the emitter area is too small, it becomes difficult from a mechanical standpoint to make electrical connections to the emitter. In general, the area of the emitter region in such transsistors should be as small as available techniques of forming that region will allow, while still providing an emitter area large enough to receive a metal contact to which a lead wire can be attached. Some high frequency transistors have an emitter region whose area is only about two square mils.

In a transistor operating at high current levels and at high frequencies, the emitter current crowds toward the outer parts of the emitter region, and consequently, the current handling capacity of the transistor is proportional at the length of the perimeter of the emitter region. Thus, although the area of the emitter region should be extremely small for the reasons discussed previously, the perimeter of that area should be relatively long in order to increase the operating current range and the maximum power rating of the transistor.

The geometry and dimensions of the ohmic contacts for the emitter and base regions also affect the characteristics of the transistor. This is particularly true if the emitter and base are diffused regions. Since lead wires cannot be bonded directly to a diffused region in semiconductor material, it is necessary to form ohmic metal contacts at the surface of the diffused regions and then attach lead wires to the contacts. In the case of the emitter contact, current flow in that contact is concentrated at the place where the lead wire is attached to it. The contact should have low resistance at the attachment area. Other portions of the emitter contact carry relatively little current, and thus need not exhibit as much conductance (or little resistance). It follows that the area of the emitter contact should be greatest at the place where the lead wire is connected to it.

It is desirable for the emitter contact and the emitter region to have circular symmetry because there is less chance that current will produce "hot spots" in them that tend to cause thermal runaway. Transistors having a circular or ring-shaped emitter are advantageous in respect. However, an emitter region having a circular perimeter does not have the greatest possible ratio of perimeter-to-area, and therefore does not provide an optimum combination of current handling and high frequency characteristics.

This invention provides a transistor with an emitter region which has a central, hub-like portion and several finger-like projections extending radially outwards from the central portion. The emitter region has a metal contact of the same configuration, and there is a metal base contact whose inner boundary closely surrounds the emitter region and is spaced uniformly from the emitter perimeter. The emitter region has a large ratio of perimeter-to-area which improves the current handling capacity of the transistor. The transistor has a higher frequency response and better low current gain than presently available transistors of the same general power rating, largely because the emitter region has less total area for a given perimeter than any other emitter configuration now in use on commercially available transistors. The improved frequency response is achieved without sacrificing surrent handling capacity because the perimeter of the emitter may be made at least as long as any other closed configuration, and because the base contact closely surrounds the emitter. Furthermore, the emitter and base contacts can be fabricated by straightforward manufacturing techniques, and although the emitter contact may be made so small as to be practically invisible to the naked eye, its central region is large enough that a tiny lead wire can be attached to it on a mass production basis. The central portion or hub of the emitter region may, for example, be as small as one-half of a mil (.0005 inch).

The fingers which project from the center of the emitter region and the emitter contact preferably taper so that they are narrowest at their outer ends, much like the points of a star. The tapering of the fingers is significant because it provides a favorable ratio of conductance versus distance from the center of the emitter where the lead is attached, and further increases the perimeter-to-area ratio. The inner boundary of the base contact is complementary with the emitter so that the base contact can be extremely close to the emitter in order to reduce the base resistance of the transistor. The emitter and base are radially symmetrical, similar to a circular emitter, but the critical perimeter-to-area ratio of the star-like emitter is greater than that of a circular emitter.

The invention will be described with reference to the accompanying drawings. Hatch lines and stipling have been used in the drawings to distinguish the various regions of he semiconductor unit from each other, but it should be noted that the semiconductor unit is a monocrystalline element of semiconductor material. The views of the drawings are greatly enlarged over actual size, and are not necessarily to a completely accurate scale.

Figure 1:
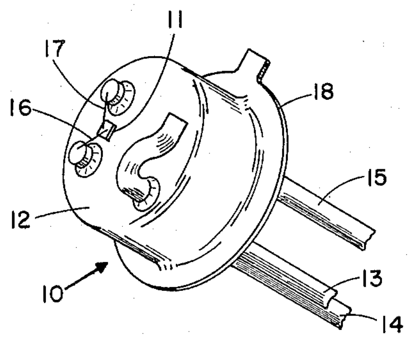
FIG. 1 is an enlarged perspective view on a scale of about ten times actual size, of a high frequency transistor device without its cover, which includes a semiconductor element in accordance with the invention.

A transistor 10 which contains a semiconductor element 11 in accordance with the invention is shown in FIG. 1. The transistor device includes a base or header 12, and the collector of the semiconductor element 11 is fused to the metal body of the header 12. Three lead wires 13, 14 and 15 extend through the header 12, and portions of these lead wires are available on the outside of the transistor for making external electrical connections to the transistor. The top of lead wire 13 is bent over and connected to the metallic body of the header 12 so that it serves as the collector lead of the transistor. Lead wires 14 and 15 are insulated from the metal of the header and serve respectively as the emitter lead and the base lead of the transistor. The emitter lead 14 is connected to an emitter contact on the semiconductor element 11 by a metal filament 16, and the base lead 15 is connected to the base contact on the semiconductor element by another metal filament 17. The lead wires 14 and 15 are close to the element 11 and therefore the filaments 16 and 17 can be very short to minimize lead inductance. To complete the transistor, a metal cover (not shown) is sealed to the flange 18 of the header.

Figure 2:
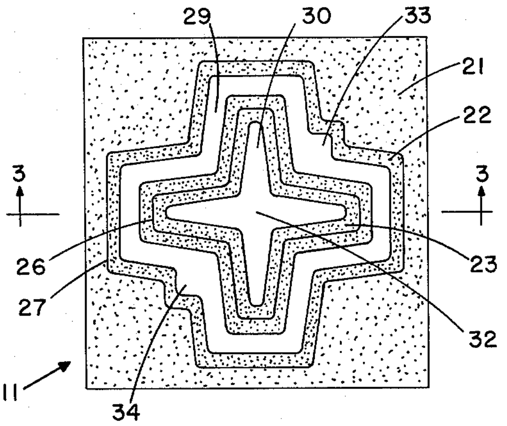
FIG. 2 is a greatly enlarged plan view on a scale of about 50 times actual size of the semiconductor element of FIG. 1, and shows the configurations of the emitter and base regions and the metal contacts for those regions.
Figure 3:
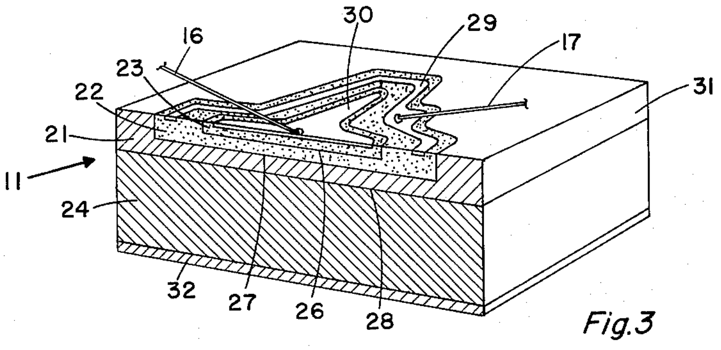
FIG. 3 is a perspective view of a section of the die element of FIG. 2 taken along line 3—3 of FIG. 2.

FIGS. 2 and 3 show the configuration of the various regions of the semiconductor element 11, and the configuration of the metal contacts to these regions. The semiconductor element to be described is of monocrystalline silicon, and various impurities are introduced into the silicon to form the emitter, base and collector regions of the semiconductor element. It will be understood that a variety of semiconductor materials and doping materials are available and the invention is not limited to the specific materials described herein. The semiconductor element 11 of FIGS. 2 and 3 includes an N-type collector region 21, a P-type base region 22, and an N-type emitter region 23. The material at 24 is N-type, like the collector region 21, but has a higher conductivity value and therefore is referred to as an $N^+$ region. The collector-base junction is at 27, and the emitter-base junction is at 26.

It may be seen in FIG. 3 that the two junctions 26 and 27 emerge at the top surface of the semiconductor element, and the plan configuration of the junctions 26 and 27 is shown perhaps best in FIG. 2. The base region 22 has a metal ohmic contact 29 on it, and the emitter region 23 has a metal ohmic contact 30 on it. It is possible to use the same metallic material for the two contacts 29 and 30, although they may be made of different metals if desired. Either aluminum or gold is a satisfactory contact material for both the emitter region and the base region. The metal is deposited on the semiconductor element by vacuum evaporation. The lateral geometry of the emitter and base contacts 29 and 30 is defined by photoengraving techniques which are well known in the semiconductor art. The metal contacts are alloyed to the semiconductor element 11.

Referring again to FIG. 3, the emitter, base and collector regions 21–23 of the illustrated embodiment are formed in an epitaxial layer 31. The layer 31 is monocrystalline silicon and may be formed on a substrate crystal of silicon by the process known as epitaxial growth. The epitaxial layer has the same crystallographic orientation as the material of the substrate 24. The layer 31 may be grown by passing a hydrogen gas stream containing vapors of a silicon halide compound, such as silicon tetrachloride, over a monocrystalline silicon substrate which is maintained at a selected temperature in the range from about 1000° C. to about 1300° C. A heterogeneous reaction takes place at the surface of the substrate crystal, and silicon deposits on that surface forming a layer which is monocrystalline and exhibits N-type conductivity upon completion. The conductivity value of epitaxial material may be controlled by adding doping impurity vapors to the gas stream, but ordinarily impurities are not added to the layer 31 because it is desirable to make the resistivity of this layer high, say 2 ohm-centimeters or more. The substrate region 24 may have a resistivity of about .15 ohm-centimeter, and the doping impurity in this region may be phosphorus, for example. The phosphorus is incorporated in the original silicon crystal from which the substrate element is obtained. Non-epitaxial transistors may be provided with emitter and base regions and contacts in accordance with the invention, if desired.

The base region 22 may be formed in the epitaxial layer 31 by a masked diffusion step in which an impurity material such as boron diffuses into the layer 31 to a depth of about 3 microns and converts the diffused region to P-type semiconductor material. The emitter region 23 may then be formed by another masked diffusion step in which impurity material such as phosphorus diffuses into the region 22 to a depth of about 2 microns and converts a portion of region 22 to N-type semiconductor material. Regions 22 and 23 both have graded resistivity. The lateral geometry of the emitter and base regions can be controlled with the use of oxide masking materials and photoengraving techniques in a manner which is well known in the semiconductor art.

The base and emitter contacts 29 and 30 are formed by vacuum evaporation, photoengraving, and alloying as previously described. Another ohmic contact 32 of a metal such as gold is applied to the bottom surface of the semiconductor element. It is common practice in the art to fabricate the emitter, base and collector regions and contacts for a large number of semiconductor elements such as the element 11, in a single larger wafer of semiconductor material. Then the wafer is divided up into individual semiconductor elements. The semiconductor elements are mounted on headers by fusing the metallic contact 32 to the metal body of the header. The filament leads 16 and 17 are bonded to the lead wires 14 and 15 and to the respective contacts 30 and 29 by a thermocompression bonding process. In FIG. 3 the filaments 16 and 17 have been reduced in size disproportionate to the scale on which the semiconductor element is shown so as to avoid obscuring the various regions of the element.

From FIG. 2, it is apparent that the emitter and base regions 22 and 23, and the respective contacts 29 and 30, have the appearance of concentric stars. The emitter region 23 and the emitter contact 30 each have four fingers which project radially from a central hub-like portion 32. The filament 16 (FIG. 3) is bonded to the central portion 32 of the emitter contact, and even though the portion 32 may have a diameter of 1 mil or less, the bonding can be accomplished effectively on a mass production basis. The filament 17 for the base contact 29 is bonded to an enlarged portion of that contact at 33, and if desired, a second connection to the base contact may be provided by bonding another filament to the enlarged portion 34 of contact 29.

The junction 26 is the outer perimeter of the emitter region, and it may be seen that the length of this perimeter is great compared to the total area of the emitter region. In fact, the perimeter-to-area ratio of the star-like emitter region is at least as great, if not greater, than that of any other closed configuration. Since the emitter region may be extremely small, the emitter-base capacitance and collector-base capacitance of the transistor is minimized in a manner which improves the high frequency response of the transistor. The relatively great length of the junction 26 which forms the emitter perimeter increases the current handling capabilities of the transistor so that it will operate satisfactorily at moderately high power levels. Thus, the transistor has a favorable combination of power and current ratings.

The small size of the emitter region and of the emitter contact 30 means that the gain of the transistor falls off less rapidly at both the high and low extremes of its operating current range than competitive transistors with less efficient emitter configurations. The gain of the transistor is more uniform at low current levels because recombination of current carriers in the base region and at the emitter-base junction has less effect on the gain of the transistor as the emitter area becomes smaller. The radial symmetry of the emitter and base regions and of the contacts to them is apparent from FIG. 2. As has already been pointed out, the radial symmetry means that current flow through the transistor is less likely to produce hot spots that can cause the phenomenon known as thermal runaway. The fingered construction of the emitter is advantageous from a thermal standpoint as compared to a circular emitter, because for emitters of equal area, there is a wider distribution of heat in the fingered type. The inner boundary of the base contact 29 is very close to and uniformly spaced from the emitter-base junction 26, and therefore the paths for emitter-base current flow are short and uniform in length. This keeps the base resistance of the transistor low, which is also desirable as will be further explained.

The tapering of the fingers of the emitter contact 30 may be seen in FIG. 2. The distribution of current flow along the length of any one finger is such that very little current flows at the tip of the finger, and current flow increases toward the center of the metal contact where the filament 16 is attached. As previously mentioned, current flow in a contact decreases with increasing distance from the point of attachment of a lead wire. Thus, it is possible to make the fingers of the emitter contact 30 very narrow so as to decrease the total area of the contact and still have a favorable ratio of conductance versus distance from the point of lead attachment in the emitter contact. It has been found that the tapering of the fingers also helps to increase the frequency response of the transistor.

Figure 4:
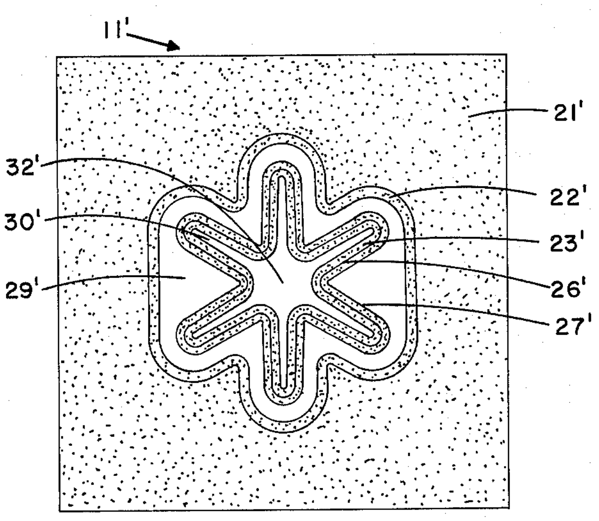
FIG. 4 is an enlarged plan view on a scale of about 80 times actual size of a semiconductor element which forms an alternate embodiment of the invention.

The emitter contact and emitter region may be provided with as many fingers as desired. FIG. 4 illustrates an embodiment of the invention which is very similar to the embodiment of FIGS. 1–3, but which includes an emitter region 23' provided with six fingers. The construction of the semiconductor element of FIG. 4 is essentially the same as that of FIGS. 2 and 3, and therefore like parts are identified by the same reference numerals. Prime designations have been added to the reference numerals in FIG. 4 because the emitter and base regions and the emitter and base contacts have a slightly different appearance than the corresponding portions of the semiconductor element of FIG. 2.

Figure 5:
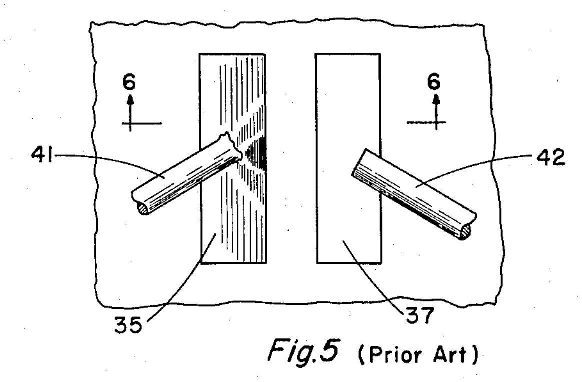
Fig.5 (Prior Art)
FIG. 5 is a greatly enlarged plan view of an emitter contact and base contact with associated alloyed regions in a transistor of the prior art which will be compared with the transistor of FIGS. 1 to 3.
Figure 6:
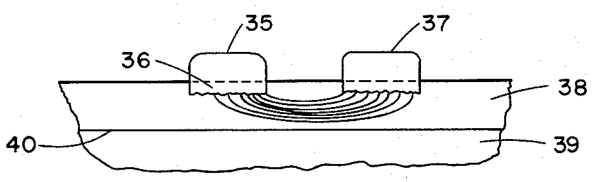
Fig.6 (Prior Art)
FIG. 6 is a sectional view taken along line 6—6 of FIG. 5 showing schematically the emitter-to-base current flow.

FIGS. 5 and 6 illustrate the emitter and base portions of a high frequency transistor of the prior art and will be described by way of comparison in order to illustrate some of the problems which are overcome by the transistor of the invention. Only fragmentary portions of the transistor are shown in FIGS. 5 and 6, and the scale is greatly enlarged. The transistor has an alloy junction type emitter 35 which includes a recrystallized alloy region 36 beneath the surface of the semiconductor element. The region 36 is roughly equivalent to the diffused emitter region 23 of the embodiment of FIGS. 2 and 3, and the metallic material above the surface of the semiconductor element constitutes an emitter contact that is roughly equivalent to the metal contact 30 of FIGS. 2 and 3. The emitter junction is at the innermost portion of the recrystallized alloy region 36. The base contact 37 is also alloyed to the semiconductor element, but is of a material which does not form a rectifying junction with the base region 38 of that element. A portion of the collector region 39 is shown in FIG. 6.

High frequency transistors of this general type often have a semiconductor element of germanium with an N-type base region 38 and a P-type collector region 39. The emitter is typically of aluminum which is alloyed to the base region, and the base contact 37 is typically of gold or gold containing a small amount of antimony. The emitter contact 35 and the base contact 37 are often in the form of strips as shown in FIG. 5, and they are typically about 1 mil wide and from 2 to 12 mils long. Metal filaments 41 and 42 are bonded to the contacts as shown in FIG. 5. Contacts of the strip type have been shown by way of example, but many other configurations such as circles, rings, combs, and the like are sometimes employed.

In a device of the type illustrated schematically in FIGS. 5 and 6, current flows from the electrical lead 41 through the emitter contact 35 and the emitter region 36 into the base region 38. Most of the current flows across the collector-base junction 40 into the collector region 39, but some current flows to the base contact 37 as indicated schematically by the curved lines in FIG. 6. The greatest current density in the emitter contact 35 is at the place where the lead 41 is attached. As the current spreads throughout the emitter contact and emitter region and passes into the base region 38, there are potential drops along the various current paths, and these potential drops are of such a polarity as to reduce the effective forward bias across the emitter-to-base junction. The parts of the emitter contact 35 and the alloy region 36 which are most remote from the lead 41 have the least forward bias, and thus current does not spread uniformly throughout the emitter contact and the emitter region.

The current which flows from the emitter junction to the base contact 37 also affects the distribution of current in the emitter contact 35. The potential dropped along the paths between the emitter and base contacts is of a polarity which acts to reduce the effective forward bias across the emitter junction. The bias reduction is greatest at portions of the emitter junction which are most remote from the base contact 37. The result is that there is a tendency for current to concentrate along the edge of the emitter that is nearest to the base contact 37, and at high current levels and at high frequencies, only the edge of the emitter which is closest to the base contact injects current into the base region. The shading on the emitter contact 35 in FIG. 5 illustrates schematically the distribution of current in the emitter contact when the transistor is operating in the manner just described. The shaded areas which are darkest have a high current density, and the lighter areas represent lower current densities. The phenomenon by which emitter current is concentrated at an edge of the emitter junction close to the base contact is usually known as the "base crowding effect."

Referring again to FIGS. 2 and 3, the operation of the emitter region 23 is also influenced by the base crowding effect. Current is injected across the emitter-base junction only at the radially outer portions of the junction when the transistor is operating at high frequencies and high current levels. However, since the emitter region has a long perimeter, the effective emitter area is reasonably large and therefore the device is capable of handling relatively high currents at high frequencies. In the emitter contact 30, current is concentrated at the central portion 32, and this portion has sufficiently low resistance to handle the high current density. Since the current density in the emitter contact 30 decreases at points more remote from the lead 16, the emitter fingers can be narrow and tapered in order to make the total emitter area as small as possible. The smaller the emitter area, the better the gain of the transistor at both low and high currents. The base resistance of the transistor is kept low by virtue of the close and uniform spacing between the base contact 29 and the emitter-base junction 26. The spacing between the emitter contact 30 and the base contact 29 may be as little as about 1½ mils, and the emitter-base junction 26 is located about midway between the two contacts. Both of the junctions 26 and 27 may be covered with silicon dioxide material in order to help protect those junctions against moisture and other impurities in the environment of the semiconductor element.

Figure 7:
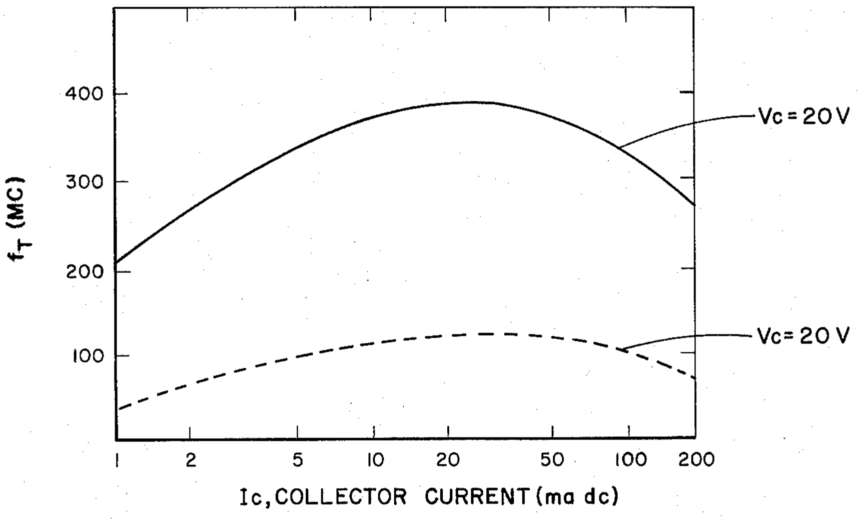
FIG. 7 is a graph which will be described to compare the device of the present invention with prior art devices.

The improved high frequency response of the transistor of FIGS. 1–3 is illustrated graphically in FIG. 7. In the graph of FIG. 7, the frequency-bandwidth product $f_T$ for current gains greater than unity is plotted on the ordinate, and the D.C. collector current in milliamps ($I_c$) is plotted on the abscissa. The curves are for a collector voltage of 20 volts. The solid line curve is a plot of $f_T$ versus $I_c$ for a transistor device in accordance with the invention, and the dashed line curve is a similar plot for the most closely competitive transistor which was available commercially prior to the invention. A formula which shows some of the factors that influence $f_T$ is a follows:

$$\frac{1}{f_T} \alpha r_e C_e + KW^2 + \ldots$$

Where:

$r_e$ is the current dependent resistance of the emitter-base junction.
$C_e$ is the capacitance value of the emitter-base junction.
W is the base width.
K is a constant.

It can be seen from FIG. 7 that $f_T$ for the transistor of the invention is considerably higher than that for the competitive transistor. Some of the factors which affect $f_T$ have been omitted in the formula set forth above, but it is apparent that the value of $f_T$ is inversely related to the emitter-to-base capacitance of the transistor. This capacitance is kept low in the transistor of the invention because its emitter has a small area. It is also important to keep the base resistance ($r_b'$) and the collector-to-base capacitance ($C_c$) low in order to increase the maximum frequency of oscillation ($F_{max.}$). This is accomplished in the transistor of the invention, while keeping its current handling capacity high, by the high perimeter-to-area ratio of the emitter and by the close and uniform spacing between the emitter and base. A generally accepted formula for calculating the maximum frequency of oscillation is $$F_{max.} = \sqrt{\frac{f_T}{8 r_b' C_c}}$$

Thus by reducing both $C_e$ and $C_c$, the maximum frequency of oscillation which can be sustained by the transistor is increased. By making the perimeter of the emitter long, the power rating of the transistor is increased.

It is apparent form the foregoing description that the transistor of the invention has an unusually desirable combination of high frequency and power handling characteristics. The improvement is a result of the star-like configuration of the emitter and base regions and their respective metal contacts. Although the small size of the various regions of the semiconductor element has been emphasized, the configuration of the regions is such that they can be fabricated by straightforward transistor manufacturing techniques on a large scale.

I claim:

1. A transistor device including in combination, a semiconductor crystal element having emitter, base and collector regions of alternate conductivity type with respective rectifying junctions between said regions, said emitter region and said base region both extending to the same surface of said crystal element, with said base region surrounding said emitter region at said surface, said emitter region having a central portion and a plurality of finger-like portions projecting radially from said central portion so that said emitter region has a relatively great perimeter-to-area ratio at said surface, a first metal contact to said emitter region at said surface of said crystal element having substantially the same configuration as that of said emitter region at said surface, and, like said emitter region, having a central portion and a plurality of finger-like portions projecting radially from said central portion so as to distribute current substantially uniformly from said central portion, a second metal contact to said base region at said surface, with said second metal contact surrounding said emitter region in close and uniformly spaced relations therewith, and means completing said transistor device including an electrical connection to said second metal contact, and another electrical connection to said central portion of said first metal contact.

2. A transistor device including in combination, a semiconductor crystal element having emitter, base and collector regions of alternate conductivity type forming an emitter-base junction and a collector-base junction, said emitter region and said base region having surface portions available at the same surface of said crystal element, with said base region surrounding said emitter region at said surface, said emitter region having a central portion and a plurality of finger portions narrower than said central portion and projecting radially from said central portion so that said emitter region has circular symmetry and has a relatively great perimeter-to-area ratio at said surface, said finger portions of said emitter region each tapering inwardly with increasing distance from said central portion of said emitter region, a first metal contact to said emitter region at said surface of said crystal element having substantially the same configuration as that of said emitter region at said surface, a second metal contact to said base region at said surface, with said second metal contact having an inner boundary surrounding said emitter region in close and uniformly spaced relation therewith, and means completing said transistor device including respective electrical connections to said contacts.

3. A transistor device including in combination, a semiconductor crystal element having emitter, base and collector regions of alternate conductivity type forming an emitter-base junction and a collector-base junction in said crystal element, said emitter region having a central portion at a surface of said crystal element and a plurality of finger-like portions narrower than said central portion and projecting radially from said central portion so that said emitter region has circular symmetry and has a perimeter-to-area ratio greater than the circumference-to-area ratio of a circle of the same over-all diameter as said emitter region, a first metal contact to said base region at said surface of said crystal element, which metal contact exhibits ohmic behavior and surrounds said emitter region at said surface in close and uniformly spaced relation therewith, a second metal contact to said emitter region which exhibits ohmic behavior, and means completing said transistor device including a thin wire bonded to the center of said second metal contact and another wire bonded to said first contact.

4. In a transistor device adapted to operate at relatively high frequencies, a semiconductor unit including in combination, a semiconductor crystal element having emitter, base and collector regions of alternate conductivity type forming an emitter-base junction and a collector-base junction in said crystal element, said emitter region having a central portion at a surface of said crystal element and at least four finger-like portions projecting radially from said central portion and spaced angularly about said central portion so that said emitter region has a relatively great perimeter-to-area ratio at said surface, said emitter region being micrometric in size with said fingered configuration thereof serving to keep the emitter capacitance value of said transistor low while providing a relatively great current carrying capacity so as to increase the power rating and high frequency rating of said transistor, a first metal contact to said emitter region at said surface of said crystal element having substantially the same fingered configuration as said emitter region, a second metal contact to said base region at said surface of said crystal element, with said second metal contact surrounding said emitter region closely and uniformly spaced therefrom so as to keep the base resistance value of said transistor low, and means completing said transistor including a thin wire bonded to said second metal contact and another thin wire bonded to the central portion of said first metal contact.

5. In a transistor device adapted to be operated at relatively high frequencies and moderately high power levels, a semiconductor unit including in combination, a semiconductor crystal element having emitter, base and collector regions therein of alternate conductivity type forming an emitter-base junction and a collector-base junction in said crystal element, said emitter region having a central portion at a surface of said crystal element and a plurality of finger portions projecting radially from said central portion and tapering inwardly toward the tips thereof so that said emitter region has circular symmetry and has a relatively great perimeter-to-area ratio at said surface, a first metal contact to said emitter region at said surface of said crystal element, with said first metal contact having a central portion and finger portions in registration with the corresponding portions of said emitter region, a first lead connection to said first metal contact at said central portion thereof, a second metal contact to said base region at said surface of said crystal element, with said second metal contact surrounding said emitter region closely and having an inner boundary uniformly spaced from the perimeter of said emitter region, and a second lead connection to said second metal contact, whereby said semiconductor unit has a favorable combination of high frequency response and current handling capacity as a result of the relationships and configurations of said emitter and base regions and the respective contacts thereto.

References Cited by the Examiner

UNITED STATES PATENTS

| | | | |
|---|---|---|---|
| 2,924,760 | 2/60 | Herlet | 317—235 |
| 3,044,147 | 7/62 | Armstrong | 317—235 X |

JOHN W. HUCKERT, *Primary Examiner.*

DAVID J. GALVIN, *Examiner.*